United States Patent [19]

Davis et al.

[11] Patent Number: 5,028,306
[45] Date of Patent: Jul. 2, 1991

[54] PROCESS FOR FORMING A CERAMIC-METAL ADDUCT

[75] Inventors: James L. Davis, Tamarac, Fla.; Ernest G. Garza, Cleveland, Ohio

[73] Assignee: Motorola, Inc., Schaumburg, Ill.

[21] Appl. No.: 576,811

[22] Filed: Sep. 4, 1990

[51] Int. Cl.⁵ .............................................. C23C 14/34
[52] U.S. Cl. .......................... 204/192.15; 204/192.17; 204/192.31; 427/38; 250/492.3
[58] Field of Search ............... 204/192.11, 192.15, 204/192.17, 192.31; 427/37, 38; 250/492.2, 492.3; 156/643

[56] References Cited

U.S. PATENT DOCUMENTS

| | | | |
|---|---|---|---|
| 4,226,932 | 10/1980 | Ferranris | 204/192.15 X |
| 4,302,498 | 11/1981 | Faith, Jr. | 204/192.15 X |
| 4,629,631 | 12/1986 | Dearnaley | 204/192.31 X |
| 4,793,908 | 12/1988 | Scott et al. | 204/192.11 X |
| 4,855,026 | 8/1989 | Sioshansi | 204/192.11 |
| 4,874,493 | 10/1989 | Pam | 204/192.11 |

Primary Examiner—Nam X Nguyen
Attorney, Agent, or Firm—Daniel K. Nichols

[57] ABSTRACT

A ceramic article is treated to increase the adhesion of metals to the ceramic article by placing the ceramic article under at least a partial vacuum. A thin film of metal is then deposited on the ceramic article by sputtering or evaporating. The metallized ceramic article is further bombarded by high energy ions, resulting in the formation of a metal-ceramic compound that renders the article more receptive to further metal deposition.

10 Claims, 1 Drawing Sheet

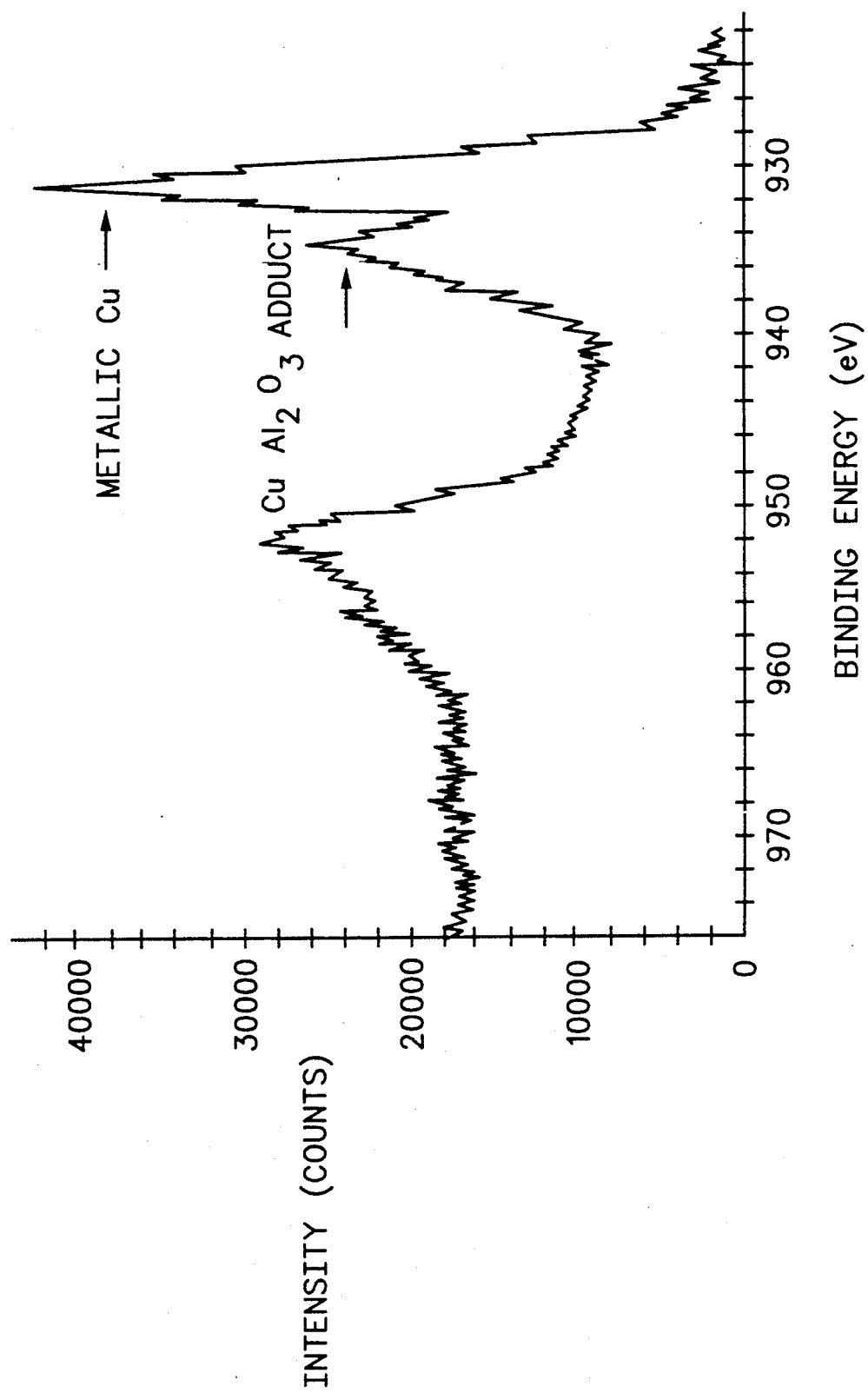

PROCESS FOR FORMING A CERAMIC-METAL ADDUCT

TECHNICAL FIELD

This invention relates generally to the use of ceramics, and more specifically to methods of plating metal to ceramics, and is particularly directed toward a means of modification of the surface chemistry of ceramics.

BACKGROUND

Ceramic technology is in large part an empirical art. The reason is that the complex systems used are not sufficiently understood to allow the effects of changes to be predicted or controlled. In the electronics industry, an aluminum oxide ceramic is commonly used as a substrate for electrical circuits. Typically, the circuit metallization pattern is effected by stencil or screen printing the desired pattern using a paste made of metal oxides, organic and inorganic binders, and other carriers. The paste is then dried and fired so that the resulting pattern consists of conductive metal particles. This method suffers from being slow and costly, and is severely limited in the degree of resolution achievable.

The second most common method is deposition of a thin film of metal on the ceramic using vacuum techniques such as evaporation or sputtering. The desired metal pattern is fabricated using photolithography and plating techniques and the undesired thin film metal is etched away. While this method is capable of significantly improved resolution as compared to the screen printing method, very few metals will adhere properly to the ceramic, and require special conditions in order to be successful.

Conventional thin film technology requires that a first metal, known as the 'glue', be deposited onto the ceramic surface. The mechanism of bonding of the glue metal to the ceramic is not thoroughly understood, but is thought to be via a bond between oxygen atoms in the ceramic and the deposited metal atom, thereby creating a strong metal-oxide bond between the metal and the ceramic. Metals used as the 'glue' typically have the property of extremely rapid oxide formation (for example, chrome, nickel, aluminum, titanium). Other metals, such as copper, cannot be successfully utilized as a 'glue' metal because the copper-oxygen reaction rate is very slow, and copper does not form the required metal-oxide bond. In order for proper ceramic-metal bonding to occur, it is imperative that the metal be deposited in pure form in an oxygen-free environment. Trace amounts of oxygen will rapidly convert the reactive metal to an oxide during deposition and prevent proper bonding to the substrate.

Once successful bonding of the 'glue' metal to the ceramic has occurred, the 'glue' metal must be maintained in an oxide free form in order to insure proper bonding of subsequent metal layers to the 'glue' metal. As in the previous interface, oxides will prevent proper adhesion between metal layers. In electronic applications, copper is typically deposited over the 'glue' metal in order to provide a relatively non-reactive surface that can be subjected to further processing, since the rate of oxide formation of copper is significantly less than that of the 'glue' metal.

The conventional method of depositing thin films of metal onto ceramic suffers from:

(1) the need to use a 'glue' metal,
(2) the need to have all traces of oxygen excluded from the deposition environment, and
(3) the relative paucity of adequate 'glue' metals.

Clearly a process that eliminates the 'glue' metal and requires less stringent control over the oxygen environment would be desirable.

SUMMARY OF THE INVENTION

Briefly, according to the invention, a ceramic article is treated to increase the adhesion of metals to the ceramic article by placing the ceramic article under at least a partial vacuum. A thin film of metal is then deposited on the ceramic article by sputtering or evaporating. The metallized ceramic article is further treated with high energy ions, resulting in the formation of a metal-ceramic compound that renders the article more receptive to further metal deposition.

BRIEF DESCRIPTION OF THE DRAWINGS

FIG. 1 is an X-Ray Photoacoustic Spectrum showing the presence of a peak indicating the existence of a copper-aluminum oxide compound.

DETAILED DESCRIPTION OF THE PREFERRED EMBODIMENT

A ceramic article is prepared for treatment by cleaning the article to remove environmental residue. The selection of the cleaning process is based on the type of residue to be removed, and can be performed by solvent cleaning, aqueous cleaning, plasma cleaning, or any combination of these or other methods known to those skilled in the art. The preferred ceramic material is alumina (aluminum oxide, Al2O3), however other ceramic materials such as titanium nitride, aluminum nitride, and barium titanate may also be substituted.

After cleaning, the ceramic article is placed in a vacuum chamber to deposit a thin film of metal. The choice of vacuum chamber and deposition process is not critical, and can be, for example, evaporation or sputter deposition, or other methods known to those skilled in the art. A thin layer of pure metal, preferably copper, is uniformly deposited on the desired surfaces of the ceramic article. Other metals such as nickel, silver, gold and palladium may be substituted for copper if desired. The deposited metal thickness should be at least 100 Ångstroms and no greater than 1000 Ångstroms, preferably 400–500 Ångstroms.

After deposition of the copper layer, the ceramic article is subjected to a flux of high energy ions. Unlike the conventional art, the process does not require total exclusion of oxygen from the environment during the treatment, and the ceramic article may even be exposed to ambient conditions for a brief time. The ceramic article may be removed from the vacuum chamber after metal deposition and placed in another vacuum chamber for the high energy ion flux treatement, or may remain in the same vacuum chamber if the equipment is so configured. Argon is used as the preferred gas to generate the ions, but other ions from the group of Noble gases (helium, neon, argon, krypton, xenon and radon) may be substituted. An ion beam with an accelerating potential of 4000–8000 electron volts may be used, with a potential of 4000 electron volts and an ion current of 20 $\mu$A being the preferred conditions. As the copper metal film is bombarded with high energy ions, the ions impart sufficient kinetic energy to create a reaction between the copper and the aluminum oxide at lattice defects in the aluminum oxide surface.

An X-Ray Photoacoustic Spectrum of a treated alumina ceramic article is shown in FIG. 1. The alumina substrate was plasma cleaned and 500 Ångstroms of copper was sputtered onto the surface while under vacuum. The metallized article was removed from the deposition chamber and placed into another vacuum chamber where the surface of the article was irradiated with a beam of high energy argon ions. The ion beam accelerating potential and current was 4000 electron volts and 20 microamps, respectively. After this treatment, the article was examined via X-Ray Photoacoustic Spectroscopy. A peak in the X-Ray Photoacoustic Spectrum at 932.4 ev is assigned to metallic copper. A second peak at 935.3 ev is assigned to a new copper-aluminum oxide adduct, formed by the treatment method. The large chemical shift of 2.9 ev can not be attributed to any known oxide of copper.

After the surface of the ceramic article has been treated as described, the ceramic article is ready for any further processing desired, such as depositing an additional layer of metal, either by plating or vacuum deposition. The formation of a copper-aluminum oxide adduct provides a superior surface for bonding additional metals to the ceramic, without the need for reactive 'glue' metals. These additional metal layers may be required, for example, to produce an electrical circuit in communications or computer equipment. The additional processing to fabricate such circuits is well known to those skilled in the art.

What is claimed is:

1. A process for treating a ceramic article to increase the adhesion of metal to the ceramic article comprising the following steps in the order named:
   placing the ceramic article under at least a partial vacuum,
   depositing a thin film of metal on the ceramic article,
   exposing the metallized ceramic article to high energy ions so as to react the metal film with the ceramic article.

2. The process of claim 1, wherein the ceramic article is selected from the group consisting of aluminum oxide, titanium nitride, barium titanate, and aluminum nitride.

3. The process of claim 2, wherein the metal is selected from the group consisting of copper, nickel, silver, gold, and palladium.

4. The process of claim 3, wherein the high energy ion is selected from the group consisting of the Noble gases.

5. The process of claim 1, wherein the metal is selected from the group consisting of copper, nickel, silver, gold, and palladium.

6. The process of claim 1, wherein the high energy ion is selected from the group consisting of the Noble gases.

7. The process of claim 1, wherein the depositing step comprises depositing the metal by sputtering.

8. The process of claim 1, wherein the depositing step comprises depositing the metal by evaporating.

9. The process of claim 1, including the further step of plasma cleaning the ceramic article prior to depositing the metal.

10. A process for treating an aluminum oxide ceramic article to increase the adhesion of metal to the article comprising the following steps in the order named:
    placing the aluminum oxide ceramic article under at least a partial vacuum,
    sputtering or evaporating a thin film of copper on the aluminum oxide ceramic article, and
    exposing the metallized aluminum oxide ceramic article to a beam of high energy argon ions so as to react the copper with the aluminum oxide ceramic article.

* * * * *